(12) United States Patent
Panteleev et al.

(10) Patent No.: US 8,775,893 B2
(45) Date of Patent: Jul. 8, 2014

(54) VARIABLE PARITY ENCODER

(75) Inventors: Pavel A. Panteleev, Moscow (RU);
Elyar E. Gasanov, Moscow (RU); Ilya V. Neznanov, Moscow (RU); Andrey P. Sokolov, Moscow (RU); Yurii S. Shutkin, Moscow (RU)

(73) Assignee: LSI Corporation, San Jose, CA (US)

( * ) Notice: Subject to any disclaimer, the term of this patent is extended or adjusted under 35 U.S.C. 154(b) by 178 days.

(21) Appl. No.: 13/351,362

(22) Filed: Jan. 17, 2012

(65) Prior Publication Data
US 2013/0019139 A1  Jan. 17, 2013

(30) Foreign Application Priority Data
Jul. 13, 2011  (RU) ................................ 2011128806

(51) Int. Cl.
*H03M 13/00* (2006.01)
*G11C 29/00* (2006.01)
*H03M 13/15* (2006.01)
*H03M 13/35* (2006.01)
*H03M 13/37* (2006.01)
*H03M 7/40* (2006.01)
*H04L 1/00* (2006.01)

(52) U.S. Cl.
CPC ........ *H03M 13/1515* (2013.01); *H03M 13/152* (2013.01); *H03M 13/6516* (2013.01); *H03M 13/617* (2013.01); *H03M 13/611* (2013.01); *H03M 13/15* (2013.01); *H03M 13/35* (2013.01); *H03M 13/3707* (2013.01); *H03M 13/6318* (2013.01); *H03M 7/40* (2013.01); *H03M 7/4031* (2013.01); *H03M 7/4093* (2013.01); *H04L 1/0047* (2013.01)
USPC ........... 714/756; 714/746; 714/752; 714/774; 714/768; 714/781; 714/782; 714/784; 714/785; 714/799

(58) Field of Classification Search
CPC .......... H03M 13/1515; H03M 13/152; H03M 13/6516; H03M 13/617; H03M 13/611; H03M 13/15; H03M 13/35; H03M 13/3707; H03M 13/6318; H03M 7/40; H03M 7/4031; H03M 7/4093; H04L 1/0047
USPC ......... 714/746, 752, 756, 774, 768, 781, 782, 714/784, 785, 799
See application file for complete search history.

(56) References Cited

U.S. PATENT DOCUMENTS

| 5,444,719 A | 8/1995 | Cox et al. ..................... 371/37.1 |
| 6,631,488 B1 * | 10/2003 | Stambaugh et al. .......... 714/746 |

(Continued)

OTHER PUBLICATIONS

Gautam et al., Study and Design of Architecture for BCH Code Encoder and Decoder, Spring 2010, California State University, Sacramento, pp. 1-137.*

(Continued)

*Primary Examiner* — John J Tabone, Jr.
(74) *Attorney, Agent, or Firm* — Christopher P. Maiorana, PC

(57) ABSTRACT

An apparatus generally having a plurality of first circuits and a second circuit is disclosed. The first circuits may be configured to (i) generate a plurality of intermediate bits by dividing a plurality data bits by a plurality of minimal polynomials of an encoding along a first path and (ii) generate a plurality of parity bits by multiplying the intermediate bits by the minimal polynomials along a second path. A number of the parity bits may be variable based on a configuration signal. The second circuit may be configured to (i) delay the data bits and (ii) generate a plurality of code bits by appending the parity bits to a last of the data bits.

18 Claims, 9 Drawing Sheets

(56) References Cited

U.S. PATENT DOCUMENTS

| | | | |
|---|---|---|---|
| 6,978,415 B1 | 12/2005 | Weng | 714/781 |
| 8,176,396 B2 * | 5/2012 | Dong et al. | 714/784 |
| 8,176,397 B2 * | 5/2012 | Panteleev et al. | 714/784 |
| 8,181,096 B2 * | 5/2012 | Andreev et al. | 714/784 |
| 8,286,060 B2 * | 10/2012 | Panteleev et al. | 714/781 |
| 8,365,054 B2 * | 1/2013 | Gasanov et al. | 714/784 |
| 8,397,143 B2 * | 3/2013 | Neznanov et al. | 714/785 |
| 8,484,541 B1 * | 7/2013 | Anholt | 714/781 |
| 8,527,851 B2 * | 9/2013 | Andreev et al. | 714/781 |
| 2003/0041300 A1 * | 2/2003 | Burns et al. | 714/784 |
| 2010/0005368 A1 | 1/2010 | Lee | 714/768 |
| 2010/0031126 A1 | 2/2010 | Andreev et al. | 714/782 |
| 2010/0042907 A1 | 2/2010 | Pilsl | 714/782 |
| 2010/0061400 A1 * | 3/2010 | Hong et al. | 370/466 |
| 2010/0070831 A1 | 3/2010 | Gasanov et al. | 714/784 |
| 2010/0253555 A1 | 10/2010 | Weingarten et al. | 341/51 |
| 2010/0332956 A1 | 12/2010 | Alrod et al. | 714/782 |
| 2011/0185265 A1 * | 7/2011 | Cherukuri | 714/782 |
| 2012/0054586 A1 * | 3/2012 | Panteleev et al. | 714/785 |
| 2012/0137190 A1 * | 5/2012 | Panteleev et al. | 714/752 |

OTHER PUBLICATIONS

Forney, Syndrome Realizations of Linear Codes and Systems, Apr. 4, 2003, IEEE, pp. 214-217.*

Truong et al., A New Decoding Algorithm for Correcting Both Erasures and Errors of Reed-Solomon Codes, Mar. 2003, IEEE, pp. 381-388.*

Horng et al., On Decoding of Both Errors and Erasures of a Reed-Solomon Code Using an Inverse-Free Berlekamp-Massey Alogrithm, Oct. 1999, IEEE, pp. 1488-1494.*

* cited by examiner

VARIABLE PARITY ENCODER

This application claims the benefit of Russian Application No. 2011128806, filed Jul. 13, 2011 and is hereby incorporated by reference in its entirety.

FIELD OF THE INVENTION

The present invention relates to block encoders generally and, more particularly, to a method and/or apparatus for implementing a variable parity encoder.

BACKGROUND OF THE INVENTION

A conventional hardware implementation of a non-reconfigurable Bose, Ray-Chaudhuri, Hocquenghem (i.e., BCH) encoder or a Reed-Solomon (i.e., RS) encoder has a start signal that tells the encoder when a new data word is ready to be encoded. Most implementations of BCH/RS encoders do not allow changes to the parameters of the BCH/RS code, such as a maximum error limit. However, modern applications of BCH/RS codes in solid state disk flash controllers are specified to change some parameters at runtime. To achieve a fast speed, a reconfiguration time of the reconfigurable controllers should be as short as possible. Hence, the reconfigurable encoders often have a configuration interface that sets the encoder into a current configuration. The configuration interface can set the maximal error limit or the number of parity bits inserted into the codes.

A typical BCH/RS encoder is conventionally implemented using a linear feedback shift register (i.e., LFSR). If the maximum error limit "T" is fixed, the coefficients of the LFSR are constants. Thus, constant multipliers are used to implement the LFSR instead of ordinary multipliers in a Galois Field (i.e., GF). The area of a constant GF-multiplier is less than the area of non-constant GF-multiplier.

Reconfigurable BCH/RS encoders can produce different numbers of parity symbols depending on the maximum error limit T. Therefore, the coefficients of the LFSR depend on the maximum error limit T and are not constants. As such, non-constant GF multipliers are commonly implemented and so significantly increase the area of the encoder.

An existing scheme that works around the non-constant multipliers uses a reconfigurable encoder as a wrapper around a non-reconfigurable encoder. For relatively small Galois Fields, the wrapper approach has an area approximately twice as large as the non-reconfigurable designs. However, the wrapper approach still suffers from the use of some non-constant multipliers and even Galois Field inversion, which can be difficult to implement with large Galois Fields. Furthermore, the wrapper encoder also is not reconfigurable on-the-fly.

In the case of binary BCH encoders, a standard implementation of a non-reconfigurable encoder performs multiplication by a constant binary matrix in GF(2). The implementation is relatively simple and area efficient (i.e., the designs only have trees of XOR gates). To implement a reconfigurable binary BCH encoder using the same scheme, the coefficients of matrixes heavily depend on the configuration data and are not easy to calculate.

It would be desirable to implement a variable parity encoder.

SUMMARY OF THE INVENTION

The present invention concerns an apparatus generally having a plurality of first circuits and a second circuit. The first circuits may be configured to (i) generate a plurality of intermediate bits by dividing a plurality data bits by a plurality of minimal polynomials of an encoding along a first path and (ii) generate a plurality of parity bits by multiplying the intermediate bits by the minimal polynomials along a second path. A number of the parity bits may be variable based on a configuration signal. The second circuit may be configured to (i) delay the data bits and (ii) generate a plurality of code bits by appending the parity bits to a last of the data bits.

The objects, features and advantages of the present invention include providing a variable parity encoder that may (i) encode BCH codes, (ii) be implemented in solid state disk flash controllers, (iii) be implemented in hard drive controllers, (iv) change configuration parameters at run time, (v) reconfigure in less than three clock cycles, (vi) be implemented in less silicon area than conventional designs, (vii) reconfigure a maximum error limit for the codes, (viii) encode binary BCH codes and/or (ix) encode Reed-Solomon codes.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Bose, Ray-Chaudhuri, Hocquenghem (e.g., BCH) codes are generally a powerful class of multiple error-correcting codes. The codes may include two important subclasses: binary BCH codes and Reed-Solomon (e.g., RS) codes. The codes generally have a wide range of applications, such as optical and wireless communications, magnetic recording systems and the like. A systematic BCH/RS encoder may convert input data into code words that, along with the original input data bits, includes a number of parity bits (or symbols). Every BCH/RS code may have a parameter, called a maximum error limit "T", which defines an error correction capability of the code. The maximum error limit may also define a redundancy of the code (e.g., the number of parity symbols). Most common hardware implementations of BCH/RS encoders/decoders deal with a fixed maximum error limit. The fixed maximum error limit generally means that the number of parity symbols is fixed and cannot be changed at runtime. However, in modern storage systems, such as controllers for a multi-level cell (e.g., MLC) flash memory, a single encoder/decoder may be specified to support many different maximum error limits, which implies a different number of parity symbols. Therefore a BCH/RS encoder/decoder used in controllers of such systems should be configurable and reconfiguration time should be as short as possible.

Some embodiments of the present invention generally provide a hardware and/or software scheme for a low-area BCH/RS encoder with on-the-fly reconfiguration. The on-the-fly reconfiguration means that a reconfiguration of the codec may be achieved in a small number of clock cycles (e.g., less than three clock cycles). Some embodiments may have a regular structure and may be conceptually simple. The scheme generally covers both binary BCH codes and RS codes. The scheme may also be used with any general BCH code. Some embodiments may be applied in modern applications of BCH/RS codes such as a solid-state disk (e.g., SSD) flash controllers and hard-drive controllers that change configuration parameters at runtime. Some implementations of the present invention may have both a low area and a small number of reconfiguration clock cycles.

Figure 1:
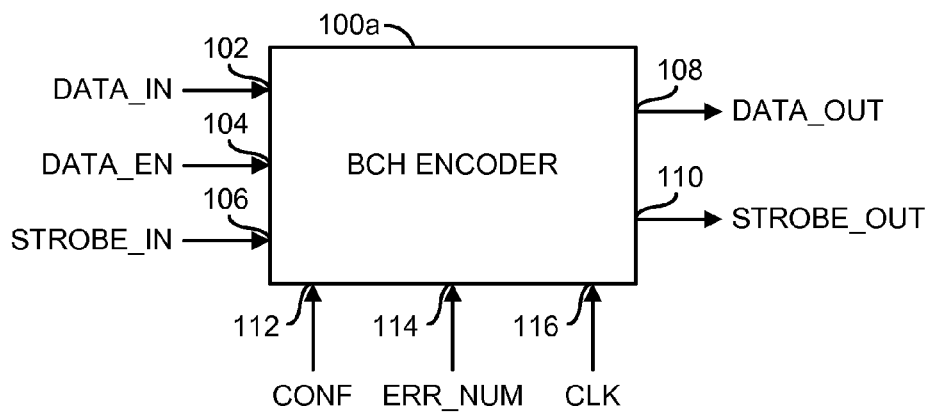
FIG. 1 is an interface diagram of an apparatus.

Referring to FIG. 1, an interface diagram of an apparatus 100a is shown. The apparatus (or circuit or device or integrated circuit) 100a may implement a configurable encoder. The apparatus 100a may implement, but is not limited to, a BCH encoder, a binary BCH encoder and/or an RS encoder. The apparatus 100a may represent modules and/or blocks that may be implemented as hardware, software, a combination of hardware and software, or other implementations.

A data input signal (e.g., DATA_IN) generated by an external source may be received by the apparatus 100a at a port 102. A data enable signal (e.g., DATA_EN) also generated by the external source may also be received by the apparatus 100a at a port 104. A strobe signal (e.g., STROBE_IN) may be received at a port 106 of the apparatus 100a from the external source. The apparatus 100a may generate and present a data output signal (e.g., DATA_OUT) at a port 108. Another strobe signal (e.g., STROBE_OUT) may be generated and presented from the apparatus 100a at a port 110. A configuration signal (e.g., CONF) may be received at a port 112 of the apparatus 100a. The apparatus 100a may receive and error number signal (e.g., ERR_NUM) at a port 114. A clock signal (e.g., CLK) may also be received by the apparatus 100a at a port 116.

The signal DATA_IN may be used for feeding data (information) words into the apparatus 100a. The data words may have a width of several bits (e.g., B bits) which are received by the port 102 of the apparatus 100a each cycle of the signal CLK. The signal DATA_EN may be set to an active state (e.g., a high or logical one condition) while the data in the signal DATA_IN is valid and an inactive state (e.g., a low or logical zero condition) while the signal DATA_IN does not contain valid data. The signal DATA_EN may alternately indicate when the data words are and are not being feed into the apparatus 100a. The signal STROBE_IN may be used to indicate when a current set of B bits at the port 102 are ready. If the signal STROBE_IN transitions to, or is in the active state, the next B bits of the data word in the signal DATA_IN may be recorded by the apparatus 100a. If the signal transitions, or is in the inactive state, the signal DATA_IN may be ignored. The signal CONF may be used to indicate a configuration cycle that sets a current error limit (e.g., T'). The signal ERR_NUM may be used to convey the current error limit T'. A value of the current error limit T' may be set into an internal encoder register of the apparatus 100a when the signal CONF is in the active state. The signal DATA_OUT may present the code words created by the apparatus 100a from the data words. The port 108 may be a multi-bit (e.g., B bit) port where B-bit portions of the code words are presented on each cycle of the signal CLK. The signal STROBE_OUT may be generated and presented by the apparatus 100a to indicate that the content of the signal DATA_OUT is a next portion of the current output code word.

A general BCH code may be established over a Galois Field GF(q), where $q=2^M$ may indicate a number of elements of the finite field and M is a positive integer. A constructive minimal distance (e.g., 2T+1) is generally defined as a set of all polynomials $C(X)=C_0+C_1X+\ldots+C_{N-1}X^{(N-1)}$ with coefficients in GF(q) such that $C(\alpha^H)=C(\alpha^{(H+1)})=\ldots=C(\alpha^{(H+2T-1)})=0$, where $\alpha$ is an N-th root of unity in an extension field $GF(q^M)$. Parameter M is generally a degree of this extension and parameter H may be a fixed number. Such codes may correct up to T errors. In practice, primitive narrow-sense BCH codes are commonly used where H=1 and $N=q^M-1$. Moreover, in many applications, two types of narrow-sense primitive BCH codes are generally used: binary BCH codes (e.g., q=2) and Reed-Solomon codes (e.g., M=1). A BCH code may be considered as a cyclic code with a generator polynomial $G(X)=G_1(X)\ldots G_S(X)$, where $G_1(X), \ldots, G_S(X)$ may be minimal polynomials over GF(q) for elements $\alpha^H$, $\alpha^{(H+1)}, \ldots, \alpha^{(H+2T-1)}$ from the extension field $GF(q^M)$. Therefore, a set of code words may be defined as the set of all polynomials $C(X)=C_0+C_1X+\ldots+C_{(N-1)}X^{(N-1)}$ such that C(X) mod G(X)=0. Some elements from the list $\alpha^H$, $\alpha^{(H+1)}, \ldots, \alpha^{(H+2T-1)}$ may have the same minimal polynomial (e.g., S may be smaller than 2T). In the case of RS codes, S=2T and $G_1(X)=X-\alpha^H, \ldots, G_{2T}(X)=X-\alpha^{(H+2T-1)}$. In the case of binary BCH codes, S may be approximately the same value as T and a degree of each polynomial $G_1(X), \ldots, G_S(X)$ is approximately M.

An encoder for a BCH code generally transforms data words (e.g., information to be transmitted through the channel) $D=(D_0, D_1, \ldots, D_{(K-1)}) \in GF(q)^K$ into code words $C=(C_0, C_1, \ldots, C_{(N-1)}) \in GF(q)^N$ of the BCH code. A method for obtaining the transformation is as follows. Let the data words be represented by a polynomial $D(X)=D_0+\ldots+D_{(K-1)}X^{(K-1)}$ and the corresponding code words represented by a polynomial $C(X)=C_0+\ldots+C_{(N-1)}X^{(N-1)}$. The encoder generally performs the transformation $D(X) \rightarrow C(X)=X^{(N-K)}D(X)+P(X)$, where polynomial $P(X)=X^{(N-K)}D(X)$ mod G(X). Therefore, $C_{(N-K)}=D_0$, $C_{(N-K+1)}=D_1, \ldots, C_{(N-1)}=D_{(K-1)}$ and the encoder may be systematic (e.g., the code words generally contain unaltered data words and some additional symbols called parity symbols). The parity symbols may be considered as coefficients of the polynomial P(X).

Figure 2:
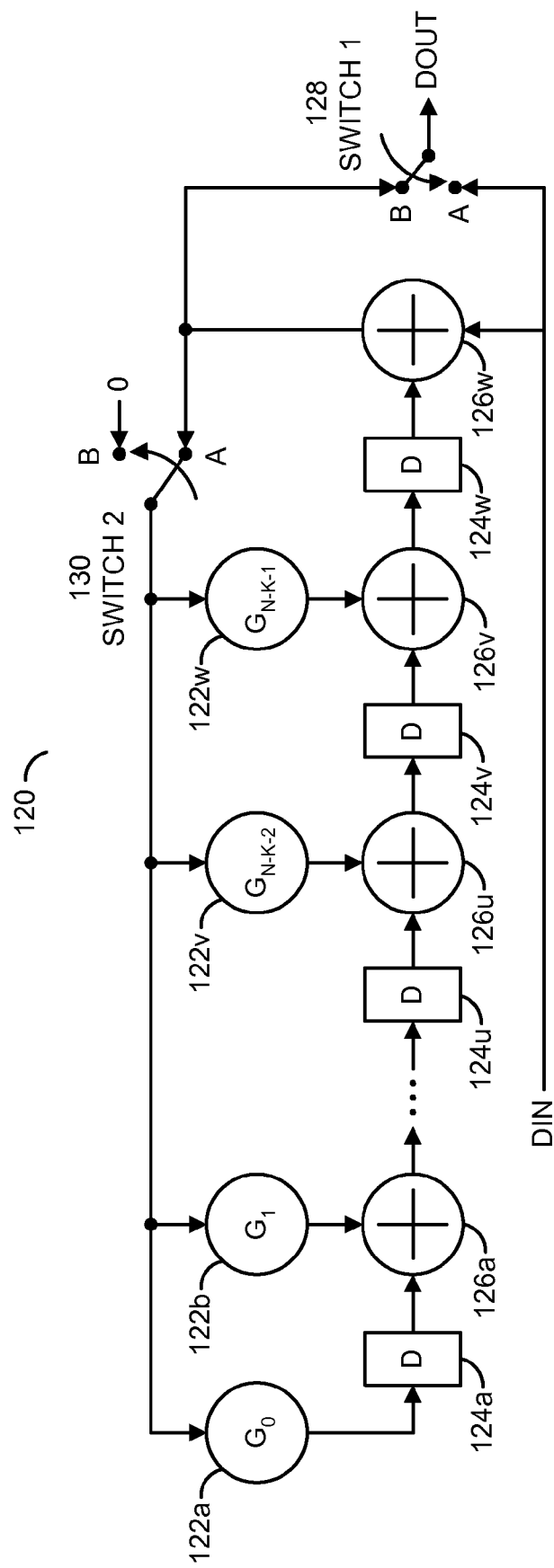
FIG. 2 is a block diagram of an example implementation of a division circuit.

Referring to FIG. 2, a block diagram of an example implementation of a circuit 120 is shown. The circuit 120 generally implements a division circuit. The circuit 120 generally comprises multiple blocks (or circuit) 122a-122w, multiple blocks (or circuits) 124a-124w, multiple blocks (or circuits) 126a-126w, a block (or circuit) 128 and a block (or circuit) 130. The circuits 120a to 130 may represent modules and/or blocks that may be implemented as hardware, software, a combination of hardware and software, or other implementations.

A signal (e.g., DIN) may be received by the circuit 120 at the circuit 126w and the circuit 128. A signal (e.g., DOUT) may be presented from the circuit 128.

Each circuit 122a-122w may implement a Galois Field multiplier circuit. Each circuit 122a-122w may be operational to multiply the value received from the circuit 130 by a respective constant value coefficient (e.g., $G_0, G_1, \ldots, G_{(N-K-1)}$). A resulting product may be presented to the respective circuits 124a and 126a-126v.

Each circuit 124a-124w may implement a register circuit. The circuits 124a-124w may be operational to buffer (or delay) the data generated by the respective circuit 122a and 126a-126v for a clock cycle of the signal CLK. The buffered data may be presented to the respective circuits 126a-126w.

Each circuit 126a-126w may implement an adder circuit. The circuits 126a-126v are generally operational to generate a sum of the product values generated by the respective circuit 122b-122w and the buffered values from the respective circuits 124a-124v. The resulting sums calculated by the circuits 126a-126v may be presented to respective next circuits 124b-124w. The circuit 126w is generally operational to generate a sum of the data in the signal DIN and the buffered value from the circuit 124w. The sum calculated by the circuit 126w may be presented to a "B" contact of the circuit 128 and an "A" contact of the circuit 130.

The circuit 128 may implement a switch circuit. The circuit 128 may be operational to present as the signal DOUT a selective one of the signal DIN while in the "A" position and the signal generated by the circuit 126w while in the "B" position.

The circuit 130 may implement another switch circuit. The circuit 130 may be operational to present to data to the circuits 122a-122w a selective one of the output of the circuit 126w while in the "A" position and a null (e.g., zero) value while in the "B" position.

Calculations of the symbols in the signal DOUT may be performed by the circuit 120, where $G(X)=G_0+G_1X+\ldots+G_{(N-K-1)}X^{(N-K-1)}+X^{(N-K)}$. The circuit 120 generally operates in N clock cycles as follows. During an initial K clock cycles, a sequence of data symbols $D_{(K-1)}, D_{(K-2)}, \ldots, D_0$ may be received in the signal DIN while both switch 1 and switch 2 are in the "A" position. Hence, in the initial K clock cycles, the signal DOUT may convey the unaltered data symbols $D_{(K-1)}, D_{(K-2)}, \ldots, D_0$. At the same time that the data symbols are being clocked through, the circuits 122a-126w generally calculate coefficients of the polynomial $P(X)=X^{(N-K)}D(X) \mod G(X)$, which may be the states of the delay elements (e.g., circuits 124a-124w) of the circuit 120 after the initial K clock cycles. The switch 1 and the switch 2 may then be moved into "B" position to extract the coefficients and the signal DATA_IN may be replaced with zeroes during the remaining N-K clock cycles. During the initial K clock cycles, the circuit 120 may calculate not only the remainder $P(X)=X^{(N-K)}D(X) \mod G(X)$ but also the quotient $Q(X)=X^{(N-K)}D(X) \div G(X)$. The quotient Q(X) may be calculated symbol by symbol through port "A" of switch 2 during first K clock cycles. Hence, $X^{(N-K)}D(X)=G(X)Q(X)+P(X)$ and therefore obtain that the code word polynomial may be defined by formula 1 as follows:

$$C(X)=X^{(N-K)}D(X)+P(X)=G(X)Q(X). \quad (1)$$

Figure 3:
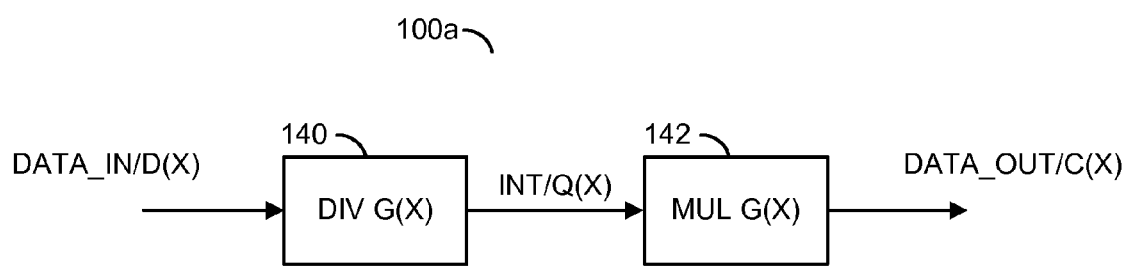
FIG. 3 is a block diagram of an example implementation of the apparatus.

Referring to FIG. 3, a block diagram of an example implementation of the apparatus 100a is shown. The apparatus 100a generally comprises a block (or circuit) 140 and a block (or circuit) 142. The circuits 140 to 142 may represent modules and/or blocks that may be implemented as hardware, software, a combination of hardware and software, or other implementations.

The signal DATA_IN may be received by the circuit 140. An intermediate signal (e.g., INT) may be generated by the circuit 140 and transferred to the circuit 142. The circuit 142 may generate and present the signal DATA_OUT.

From formula 1, calculation of the code word polynomial C(X) from the data polynomial D(X) generally involves calculating the quotient $Q(X)=X^{(N-K)}D(X) \div G(X)$ and then multiply the quotient Q(X) by the polynomial G(X). The quotient Q(X) may be calculated by the circuit 140 and presented in the signal INT. The circuit 142 may receive the quotient Q(X) and calculate the code word C(X), which is presented in the signal DATA_OUT.

The circuit 140 may implement a variable-length linear feedback shift register circuit. The circuit 140 is generally operational to calculate the quotient Q(X) based on the data word D(X) received in the signal DATA_IN. In some embodiments, the circuit 140 may implement one or more of the circuits 120 arranged in a serial order. Other designs may be implemented to meet the criteria of a particular application.

The circuit 142 may implement a variable-length multiplication circuit. The circuit 142 is generally operational to calculate the code words C(X) by multiplying the quotient Q(X) received in the signal INT by the generator polynomial G(X) (e.g., $G_1(X), G_2(X), \ldots, G_S(X)$). The code words may be presented in the signal DATA_OUT.

The circuit 140 generally calculates the quotient $Q(X)=X^{(N-K)}D(X) \div G(X)$ using port "B" of switch 1 (see circuit 120) as an output path. The circuit 142 may perform a series of multiplications by the generator polynomial G(X). For proper operation of the circuit 142, the circuit 140 may also present a series of zero values in the signal INT after transferring the quotient Q(X).

Figure 4:
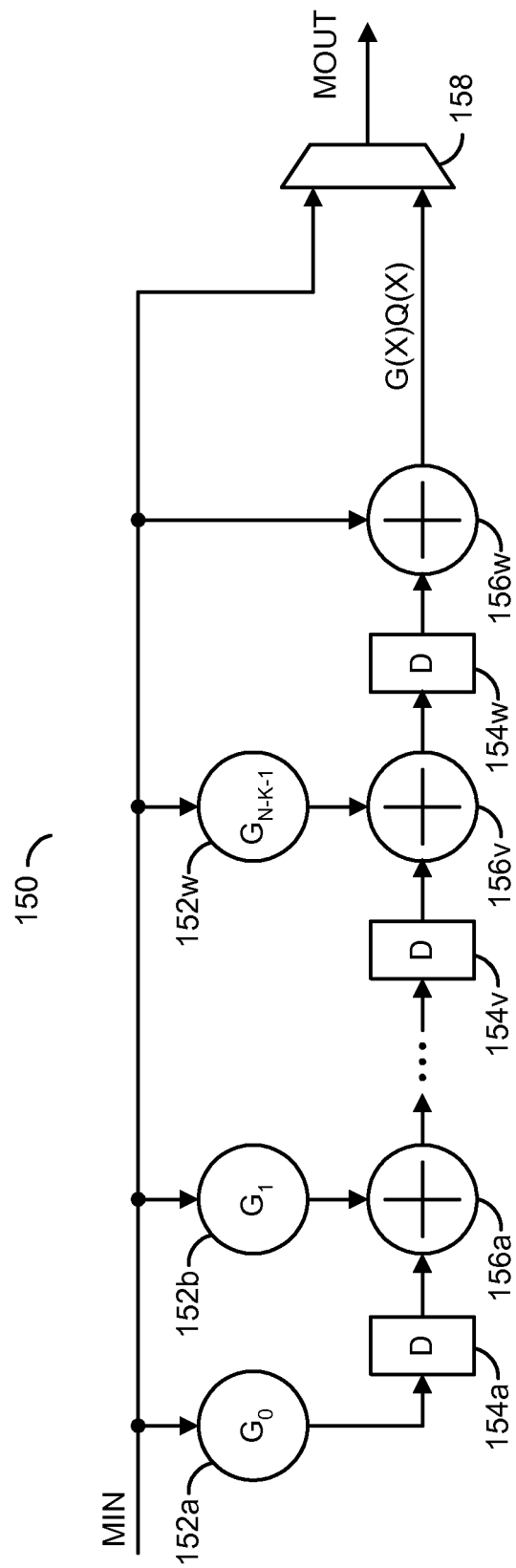
FIG. 4 is a block diagram of an example implementation of a multiplication circuit.

Referring to FIG. 4, a block diagram of an example implementation of a circuit 150 is shown. The circuit 150 may implement a multiplication circuit. The circuit 150 generally comprises multiple blocks (or circuits) 152a-152w, multiple blocks (or circuits) 154a-154w, multiple blocks (or circuits) 156a-156w and a block (or circuit) 158. The circuits 154a to 158 may represent modules and/or blocks that may be implemented as hardware, software, a combination of hardware and software, or other implementations. A signal (e.g., MIN) may be received by the circuits 154a-154w and the circuit 158. The circuit 158 may generate and present a signal (e.g., MOUT).

Each circuit 152a-152w may implement a Galois Field multiplier circuit. Each circuit 152a-152w may be operational to multiply the quotient Q(X) received from the signal MIN by a respective constant value (e.g., $G_0, G_1, \ldots, G_{(N-K-1)}$). A resulting product may be presented to the respective circuits 154a and 156a-156v.

Each circuit 154a-154w may implement a register circuit. The circuits 124a-124w may be operational to buffer (or delay) the values generated by the respective circuit 152a and 156a-156v for a clock cycle of the signal CLK. The buffered data may be presented to the respective circuits 156a-156w.

Each circuit 156a-156w may implement an adder circuit. The circuits 156a-156v are generally operational to generate a sum of the product values generated by the respective circuits 152b-152w and the buffered values from the respective circuits 154a-154v. The resulting sums calculated by the circuits 156a-156v may be presented to respective next circuits 154b-154w. The circuit 156w may be operational to generate a sum of the data in the signal MIN and the buffered value from the circuit 154w. The sum calculated by the circuit 156w may be presented to the circuit 158.

The circuit 158 may implement a multiplexer circuit. The circuit 158 is generally operational to generate the signal MOUT by selectively multiplexing the signal MIN and the sum (e.g., G(X)Q(X)) generated by the circuit 156w.

Multiple copies of the circuit 120 arranged in an output-to-input series may implement the circuit 140. Multiple copies of the circuit 150 arranged in an output-to-input series may implement the circuit 142. The switches 1 in the circuit 140 and the circuit 158 in the circuit 142 may provide support for variable redundancy BCH codes. Where the switch 1 is in the "A" position, an individual circuit 120 may pass the data word D(X) through without modification. Where the circuit 158 multiplexes from the signal MIN to the signal MOUT, an individual circuit 150 may pass the quotients Q(X) through without modification.

Figure 5:
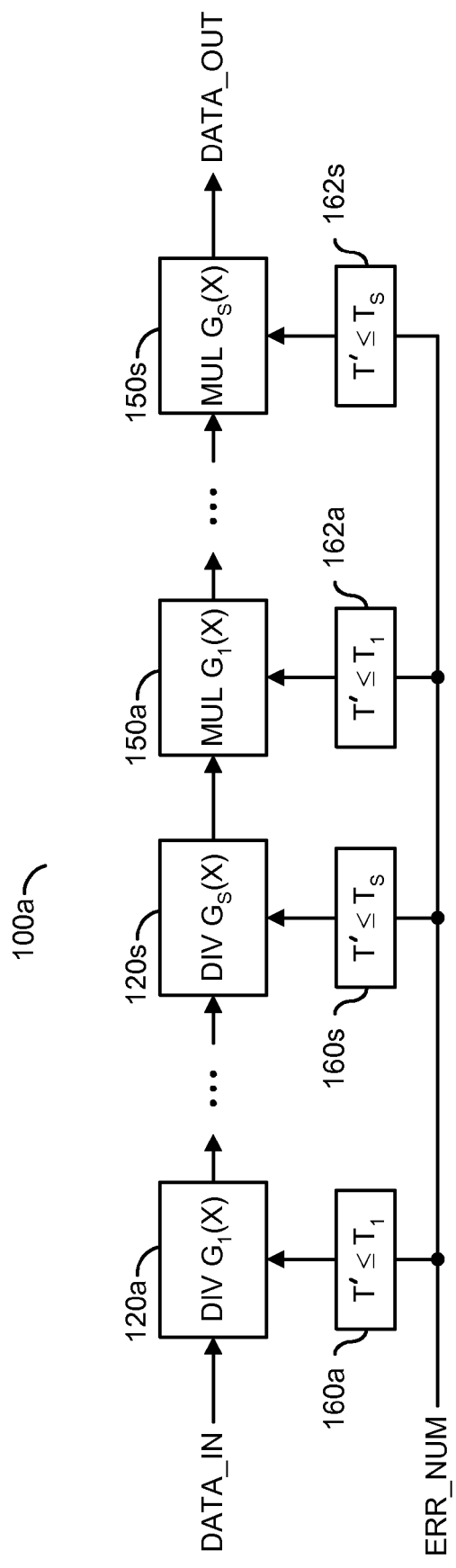
FIG. 5 is a detailed block diagram of the example implementation of the apparatus.

Referring to FIG. 5, a detailed block diagram of an example implementation of the apparatus 100a is shown. The apparatus 100a generally comprises multiple circuits 120 (marked as circuits 120a-120s) and multiple circuits 150 (marked as circuits 150a-150s), multiple blocks (or circuits) 160a-160s and multiple blocks (or circuits) 162a-162s. The circuit 120a may receive the signal DATA_IN (e.g., the signal DIN in FIG. 2). The signal INT may be generated by the circuit 120s (e.g., the signal DOUT in FIG. 2) and transferred to the circuit 150a (e.g., the signal MIN in FIG. 4). The circuit 150s may generate the signal DATA_OUT (e.g., the signal MOUT in FIG. 4). The signal ERR_NUM may be received by each circuit 160a-160s and 162a-162s.

The generator polynomial G(X) may define the minimal polynomials $G_1(X), G_2(X), \ldots, G_S(X)$ over GF(q) for elements $\alpha^H, \alpha^{(H+1)}, \ldots, \alpha^{(H+2T-1)}$ from the extension field $GF(q^M)$. For a fixed parameter T, the apparatus 100a may support any general BCH code with a maximal error limit T' which is no more than T. For any particular T', a corresponding generator polynomial may be defined as G' $(X)=G_1(X)G_2(X) \ldots G_{S'}(X)$, where S'≤S. For any i=1, 2, ..., S, a maximal value of T' when a polynomial $G_i(X)$ occurs in the generator polynomial G'(X)=$G_1(X)G_2(X) \ldots G_S(X)$ may be denoted as $T_i$.

Each circuit 120a-120s generally implements a copy of the circuit 120 using the coefficients from a respective minimal polynomial $G_1(X), G_2(X), \ldots, G_S(X)$. The circuits 120a-120s may be connected in series and share the signals DIN and DOUT between adjoining circuits 120a-120s. The switch 1 in each circuit 120a-120s may be controlled by a respective circuit 160a-160s.

Each circuit 150a-150s generally implements a copy of the circuit 150 using the coefficients from a respective minimal polynomial $G_1(X), G_2(X), \ldots, G_S(X)$. The circuits 150a-150s may be connected in series and share the signals MIN and MOUT between adjoining circuits 150a-150s. The circuit 158 in each circuit 150a-150s may be controlled by a respective circuit 162a-162s.

Each circuit 160a-160s may implement a compare circuit. The circuits 160a-160s are generally operational to compare an internal threshold (e.g., thresholds $T_1$-$T_S$, where $T_1 < T_2 < \ldots < T_S$ with the programmable error limit value T' in the signal ERR_NUM. If the value T' is not greater than a threshold Tj (for j=1, 2, ..., S), the circuit 160j may command the corresponding circuit 120j to operate as a divider circuit. If the value T' is greater than the threshold Tj, the switch 1 in the circuit 120j may stay in the "A" position and circuit 120j passes the data through without modification (e.g., the signal DOUT=DIN).

Each circuit 162a-162s may implement a compare circuit. The circuits 162a-162s are generally operational to compare an internal threshold (e.g., thresholds $T_1$-$T_S$, where $T_1 < T_2 < \ldots < T_S$ with the programmable error limit value T' in the signal ERR_NUM. If the value T' is not greater than a threshold Tj (for j=1, 2, ..., S), the circuit 162j may command the corresponding circuit 150j to operate as a multiplier circuit. If the value T' is greater than the threshold Tj, the circuit 158 in the circuit 150j may pass the data through without modification (e.g., the signal MOUT=MIN).

Operation of the circuits 160a-160s and 162a-162s generally enables the apparatus 100a to reconfigure the encoding operation to any number for the error limit value T'. The reconfiguration may take place on-the-fly since the circuits 120a-120s, 150a-150s, 160a-160s and 162a-162s may respond to a change in the value carried by the signal ERR_NUM within a single clock cycle of the signal CLK.

The apparatus 100a generally uses the fact that two sequential schemes that perform a multiplication by f(x) and a subsequent multiplication by g(x) may produce the same results as a multiplication by f(x)g(x). Furthermore, a result of work for two sequential schemes that perform a division by f(x) and a subsequent division by g(x) may produce the same results as a division by f(x)g(x). Therefore, after comparing the current error limit T' with the thresholds $T_1$-$T_S$, the apparatus 100a may calculate the code word C(X) based on the current generator polynomial G'(X)=$G_1(X), G_2(X), \ldots, G_S(X)$. In some embodiments, an increase in performance may be achieved by adding pipeline registers between the individual circuits 120a-120s and 150a-150s.

Figure 6:
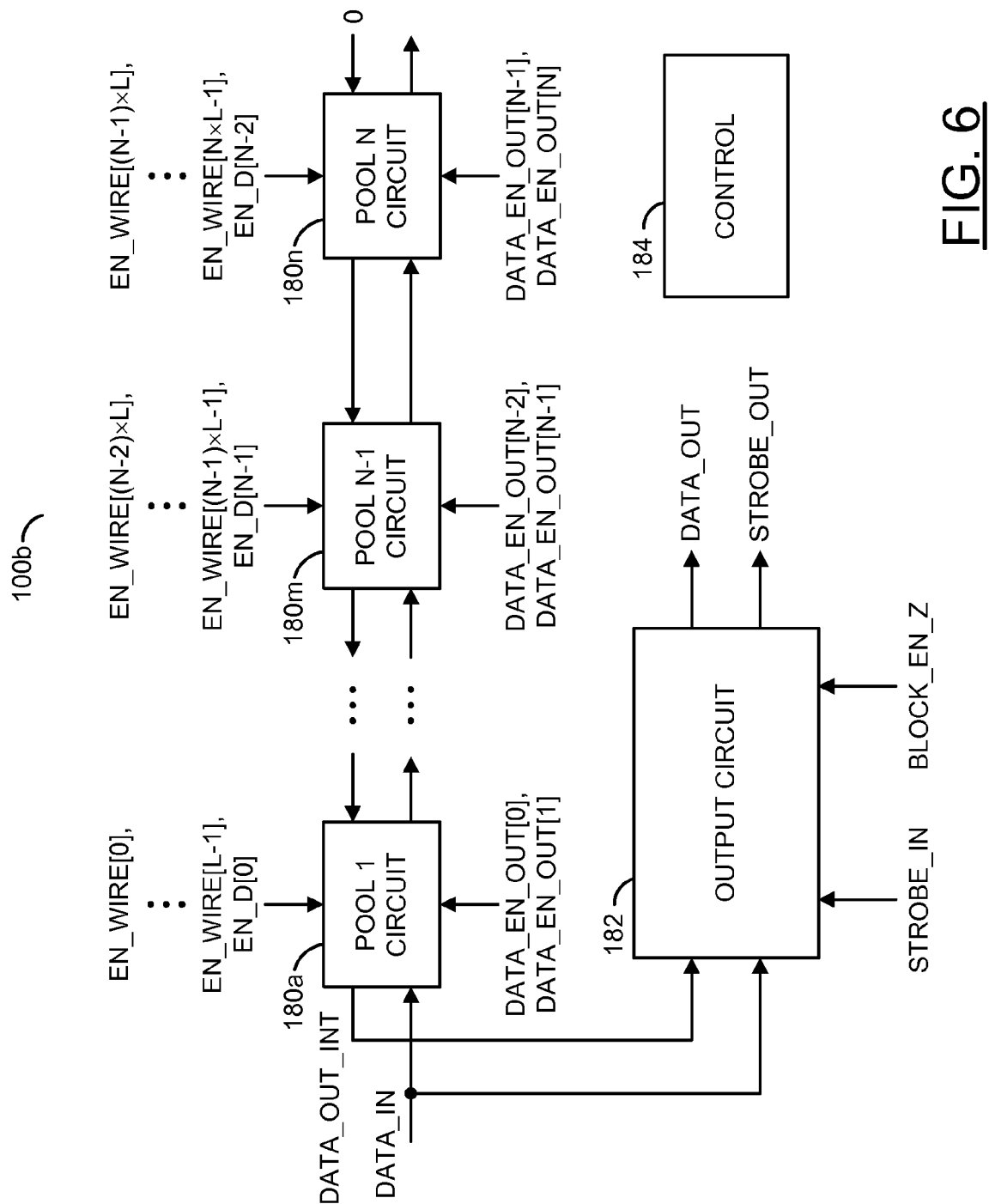
FIG. 6 is a detailed block diagram of an example implementation of an apparatus in accordance with a preferred embodiment of the present invention.

Referring to FIG. 6, a detailed block diagram of an example implementation of an apparatus 100b is shown in accordance with a preferred embodiment of the present invention. The apparatus (or circuit or device or integrated circuit) 100b may implement a configurable encoder. The apparatus 100b may implement, but is not limited to, a BCH encoder, a binary BCH encoder or an RS encoder. Since the number of circuits 120a-120s matches the number of circuits 150a-150s (FIG. 5), some reduction in the circuitry area of the apparatus 100a may be achieved by using common hardware for the division operations and the multiplication operations. The apparatus 100b may be a variation of the apparatus 100a implementing the common circuitry. A scheme of the apparatus 100b may have a small area and may achieve at high encoding speed.

The apparatus 100b generally comprises multiple blocks (or circuits) 180a-180n, a block (or circuit) 182 and a block (or circuit) 184. The circuits 180a-184 may represent modules and/or blocks that may be implemented as hardware, software, a combination of hardware and software, or other implementations.

The signal DATA_IN may be received by the circuits 180a and 182. The signal STROBE_IN may be received by the circuit 182. The circuit 182 may generate the signal DATA_OUT. The signal STROBE_OUT may also be generated and presented by the circuit 182. The circuit 180a may also generate an internal signal (e.g., DATA_OUT_INT) which is received by the circuit 182. The circuit 184 may generate multiple signals (e.g., EN_WIRE[0]-EN_WIRE[N× X-1]) which are received by the circuits 180a-180n. The circuit 184 may also generate multiple signals (e.g., EN_D [0]-EN_D[N-2]) which are also received by the circuits 180a-180n. The circuit 184 may generate multiple signals (e.g., DATA_EN_OUT[0]-DATA_EN_OUT[N]) which are received by the circuits 180a-180n. Furthermore, the circuit 184 may generate a signal (e.g., BLOCK_EN_Z) which is received by the circuit 182.

Figure 7:
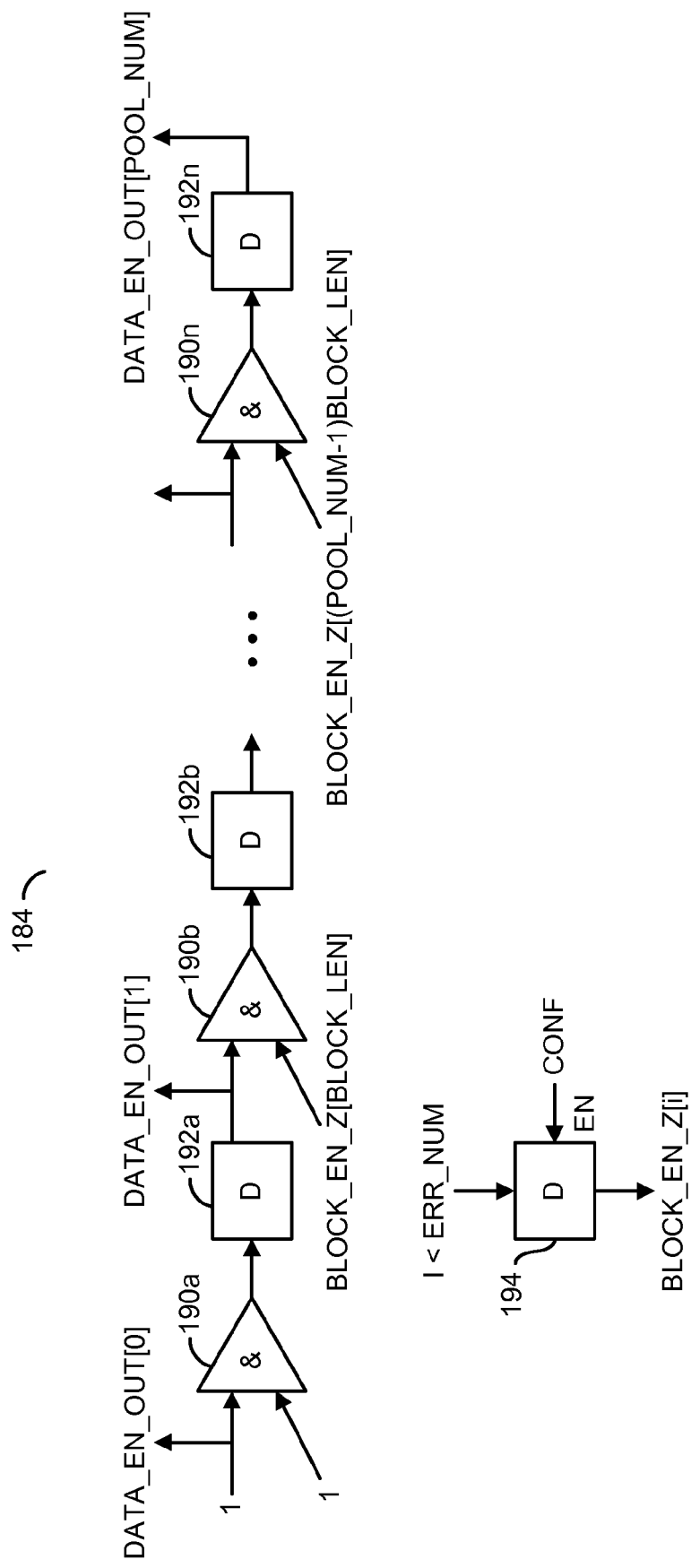
FIG. 7 is a detailed block diagram of an implementation of a control circuit.

Referring to FIG. 7, a detailed block diagram of an implementation of the circuit 184 is shown. The circuit 184 may implement a control circuit. The circuit 184 generally comprises multiple blocks (or circuits) 190a-190n, multiple blocks (or circuits) 192a-192n and multiple blocks (or circuits) 194 (only one shown). The circuits 190a-194 may represent modules and/or blocks that may be implemented as hardware, software, a combination of hardware and software, or other implementations.

The circuit 184 may fix the signal DATA_OUT_EN[0] to a logical high (or one) state. Each circuit 192a-192n may generate a corresponding signal DATA_EN_OUT[1]-DATA_EN_OUT[POOL_NUM]. Each circuit 184a-184n may receive a signal (e.g., I). The signal CONF may be received by the circuits 184a-184n at an enable (e.g., EN) port. Each circuit 194 may generate a respective signal BLOCK_EN_Z [i] which is received by a corresponding circuit 190b-190n and the circuit 182.

Each circuit 190a-190n may implement a Boolean logical AND gate. The circuit 190a may be operational to logically AND the signal DATA_EN_OUT[0] and a logical one value. Each circuit 190b-190n may be operational to logically AND a respective signal DATA_EN_OUT[i] and a respective signal BLOCK_EN_Z[i].

Each circuit 192a-192n may implement a register circuit. The circuits 192a-192n may be operational to buffer (or delay) the signals generated by the respective circuit 190a-190n for a clock cycle of the signal CLK. The buffered data may be presented to the next circuit 190b-190n in series.

Each circuit 194 may implement a register circuit. The circuits 194 may be operational to buffer (or delay) the signal ERR_NUM where I<ERR_NUM and the signal CONF is in the active condition. The buffered data may be presented in the respective signals BLOCK_EN_Z[0]-BLOCK_EN_Z [(POOL_NUM−1)×BLOCK_LEN)].

The circuit 184 may also generate several other signals as follows:

EN_WIRE[i]=a clock cycle delayed (BLOCK_EN_Z[i] AND EN_D[i/BLOCK_LEN]) for i=0, 1, . . . , GEN_POL_DEG−1.

LAST_POOL[i]=BLOCK_EN_Z[i•BLOCK_LEN] AND (NOT(BLOCK_EN_Z[(i+1)•BLOCK_LEN])) for i=0, 1, . . . , POOL_NUM−2.

LAST_POOL[POOL_NUM−1]=BLOCK_EN_Z [(POOL_NUM−1)•BLOCK_LEN].

LAST_BACK[i]=LAST_POOL[i] AND (DATA_EN_OUT[i+1] OR FB_OUT[i]) for i=0, 1, . . . , POOL_NUM−1.

BACK_EN[i]=NOT(DATA_EN_OUT[i] AND (LAST_BACK[i] OR FB_OUT[i+1])) for i=0, 1, . . . , POOL_NUM−2.

BACK_EN[POOL_NUM−1]=NOT(DATA_EN_OUT [POOL_NUM−1] AND (LAST_BACK[POOL_NUM−1])).

BACK_EN [i]=a clock cycle delayed (FB_OUT[i]).

EN_D[i]=(DATA_EN_OUT or LAST_POOL[i]) ? EN_OUT[i]: (BACK_EN [i] AND EN_OUT[2•POOL_NUM−2−i] for i=0, 1, . . . , POOL_NUM−1 wherein A?B:C means if A is true, return B else return C.

LAST_POOL[i]=1 if and only if (iff) the pool number i is the last active pool, which depends on ERR_NUM.

LAST_BACK[i]=1 if and only if pool number i is the last pool and the current cycle is an initial cycle when input data is not available.

BACK_EN[i]=1 if and only if the backward phase reaches the input of pool number i.

BACKWARD_OUT[i] is a delayed version of the previews wire.

EN_D[i]=1 if and only if pool number i is active.

EN_WIRE[i]=1 if and only if the enable of the registers of pool number i is 1.

DATA_EN_OUT[i]=1 if and only if the forward phase reaches pool number i.

BLOCK_EN_Z[i]=1 if and only if the block number i is active.

Figure 8:
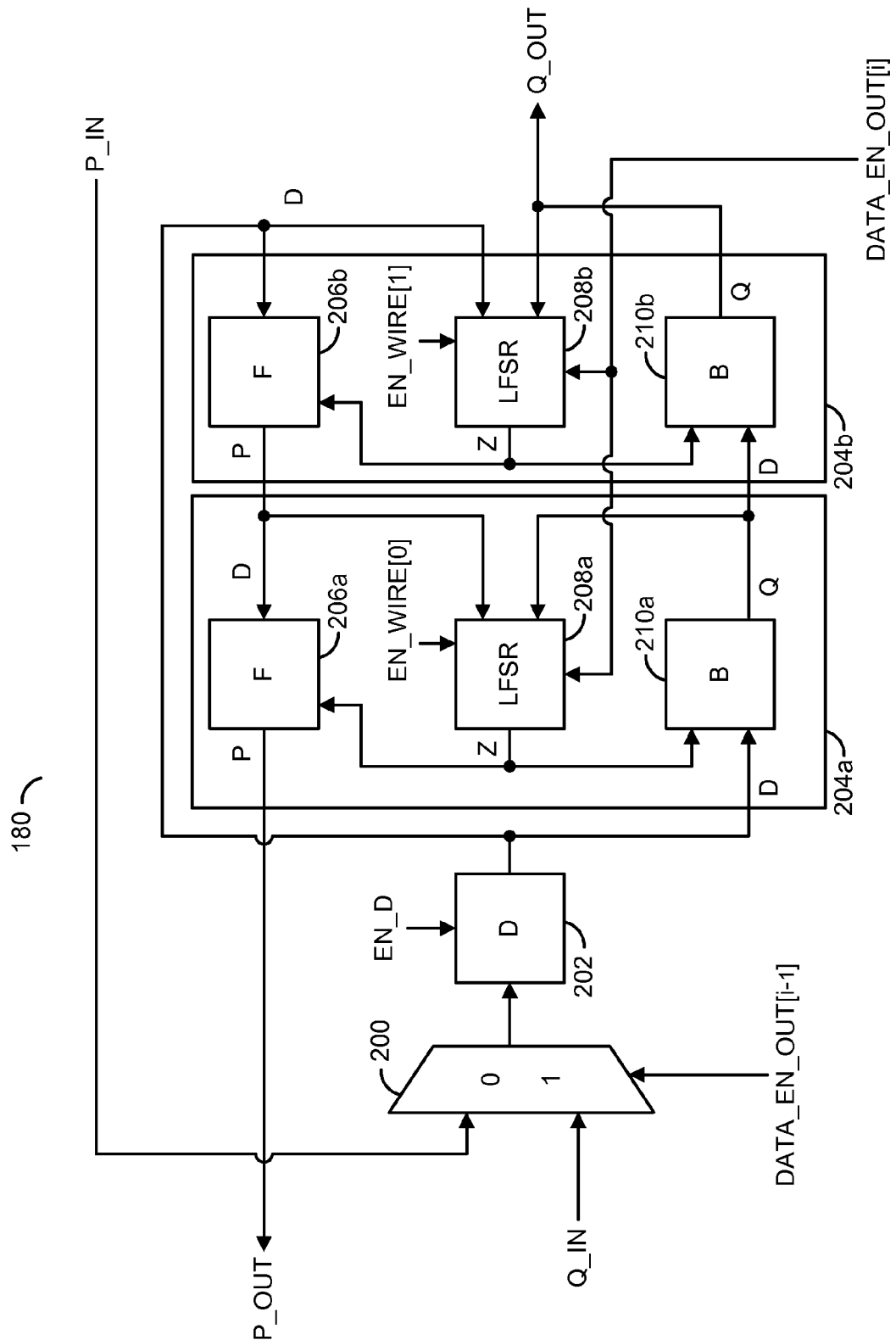
FIG. 8 is a detailed block diagram of an implementation of a pool circuit.

Referring to FIG. 8, a detailed block diagram of an implementation of a circuit 180 is shown. The circuit 180 may implement a pool circuit. The circuit 180 generally represents each circuit 180a-180n. The circuit 180 generally comprises a block (or circuit) 200, a block (or circuit) 202 and multiple blocks (or circuits) 204a-204b. Each circuit 204a-204b generally comprises a respective block (or circuit) 206a-206b, a respective block (or circuit) 208a-208b and a respective block (or circuit) 210a-210b. The circuits 200-210b may represent modules and/or blocks that may be implemented as hardware, software, a combination of hardware and software, or other implementations.

A signal (e.g., Q_IN) may be received by the circuit 200. Another signal (e.g., P_IN) may also be received by the circuit 200. The signal DATA_EN_OUT[i−1] may be received as a control signal by the circuit 200. The signal DATA_EN_OUT[i] may be received by the circuits 208a-208b. The signals EN_WIRE[i−1]-EN_WIRE[i] may be received by the circuits 208a-208b respectively. A signal (e.g., Q_OUT) may be generated by the circuit 210b.

Referring to FIGS. 6 and 8, each circuit 180a-180n may be referred to as a pool. Each circuit 180a-180b generally comprises a number (e.g., pool length) of the circuits 204a-204b. The circuits 204a-204b may be referred to as pool blocks. A total number of pool blocks (e.g., BLOCK_NUM) in the apparatus 100b may be a product of the number of pools (e.g., POOL_NUM) and each pool length (e.g., POOL_LEN), BLOCK_NUM=POOL_NUM×POOL_LEN. Each of the BLOCK_NUM of pool blocks may be related to a corresponding polynomial $G_1(X), G_2(X), \ldots, G_S(X)$. Each polynomial $G_1(X), G_2(X), \ldots, G_S(X)$ may be a minimal polynomial over GF(q) for elements $\alpha^H, \alpha^{(H+1)}, \ldots, \alpha^{(H+2T-1)}$.

The circuit 200 may implement a multiplexer circuit. The circuit 200 is generally operational to multiplex the signals P_IN and Q_IN to the circuit 202. Control of the multiplexing may be provided by the signal DATA_EN_OUT[i−1]. When the data words in the signal Q_IN are traversing through the circuit 180a-180n in a backwards direction, the circuit 200 may multiplex the signal Q_IN to the circuit 202. When the parity words in the signal P_IN are traversing through the circuits 180a-180n in the forward direction, the circuit 200 may multiplex the signal P_IN to the circuit 202.

The circuit 202 may implement a register circuit. The circuit 202 may buffer (or delay) the signal received from the circuit 200 by a clock cycle of the signal CLK. The buffering may be enabled/disabled based on a signal (e.g., EN_D).

Each circuit 204a-204b may implement a pool block. The circuits 204a-204b are generally operational to selectively (i) multiply the data words by a corresponding minimal polynomial and (ii) divide the quotients by the corresponding minimal polynomial. In the backwards direction, each circuit 204a-204b may perform the same functionality as the corresponding circuits 120a-120b in FIG. 5. In the forward direction, each circuit 204a-204b may perform the same functionality as the corresponding circuits 150a-105b in FIG. 5.

Each circuit 206a-206b may implement a forward block. The circuits 206a-206b are generally operational to generate a value (e.g., P) by summing values D and Z (e.g., $D=(D_0, \ldots, D_{(b-1)})$ and $Z=(Z_0, \ldots, Z_{(w-1)})$. Operation of the circuits 206a-206b may be defined by formula 2 as follows:

$$P_i = D_i + Z_{(w-1-i)} + \sum_{j=0}^{i-1} D_j F_{(m-i+j)} \text{ for } i < w, \text{ where } w \quad (2)$$
$$= \min\{m, b\}$$
$$= D_i + D_{(i-m)} + \sum_{j=0}^{m-2} D_{(i-m+1+j)} F_{(j+1)} \text{ for } m \leq i < b$$

The polynomial $F=F_0+F_1X+\ldots+F_mX^m$ may be a polynomial that corresponds to the current pool block, "m" may be a degree and parameter "b" may be a bus width matching the data width B of the port 102.

Figure 10:
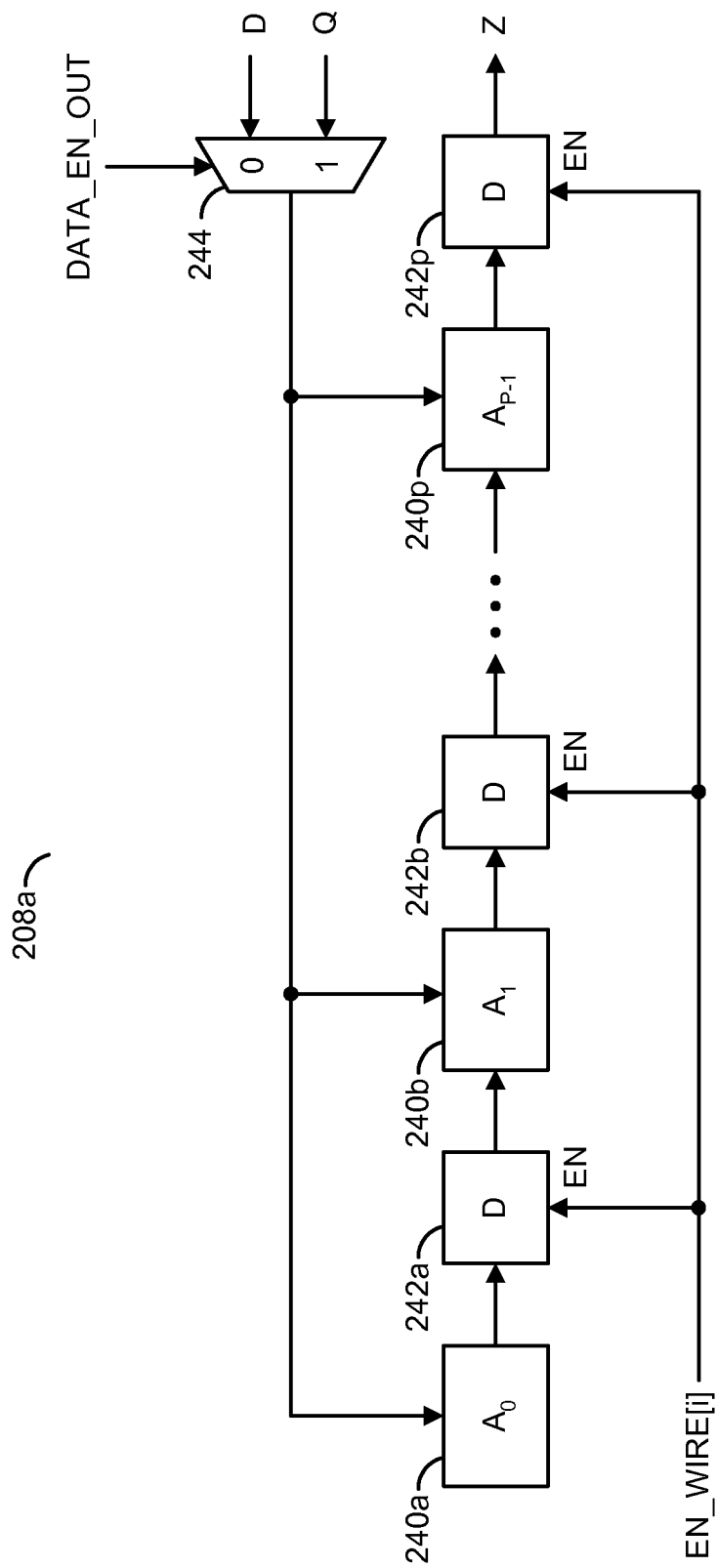
FIG. 10 is a block diagram of an example implementation of a b-unfolded linear feedback shift register circuit.

Each circuit 208a-208b may implement a linear feedback shift register circuit (see FIG. 10). Each circuit 208a-208b may correspond to the polynomial $F_0+F_1X+\ldots+F_mX^m$. Each circuit 208a-208b may be a b-unfolded version of a standard linear feedback shift register. Additional details for the b-unfolding may be found in "Eliminating The Fanout Bottleneck In Parallel Long BCH Encoders", by K. K. Parhi, Communications, 2004, IEEE International Conference, which is hereby incorporated by reference in its entirety.

Each circuit 210a-210b may implement a backwards block The circuits 210a-210b are generally operational to generate a value (e.g., Q) by summing the values D and Z. Operation of the circuits 210a-210b may be defined by formula 3 as follows:

$$Q_i = \sum_{j=0}^{i} u_{ij} x_j \qquad (3)$$

where $X_j=D_j=Z_{(w-1-j)}$, $j=0,\ldots, w-1$, $X_j=D_j$ and $i \geq w$ and $$U_{ij} = \sum_{j=m-i}^{m} F_j U_{(i-m+j,1)} \text{ for } 1 < i,$$

and $U_{ii}=1$ and $U_{il}=0$ for $l>i$.

The example implementation of the circuit 180 as illustrated generally comprising two circuits 204a-204b (e.g., POOL_LEN=2). A generalization to an arbitrary pool length is straightforward. Other numbers of circuits 204a-204b may be implemented to meet the criteria of a particular application.

Figure 9:
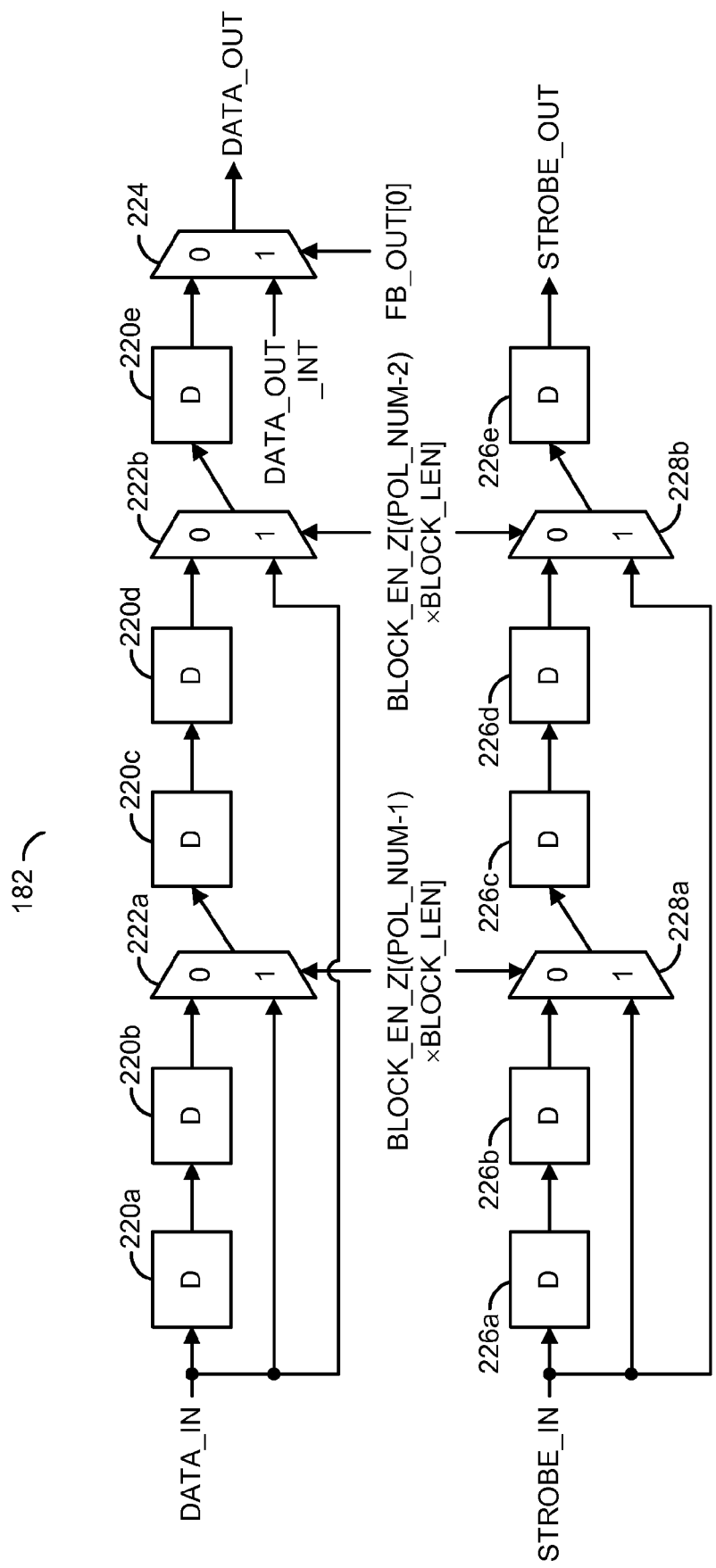
FIG. 9 is a block diagram of an example implementation of an output circuit.

Referring to FIG. 9, a block diagram of an example implementation of the circuit 182 is shown. The circuit 182 may implement an output circuit. The implementation illustrated generally supports three pools (e.g., POOL_NUM=3) with each pool having a length of two (e.g., POOL_LEN=2). A generalization to an arbitrary number of pools and pool lengths is straightforward.

The circuit 182 generally comprises multiple blocks (or circuits) 220a-220e, multiple blocks (or circuits) 222a-222b, a block (or circuit) 224, multiple blocks (or circuits) 226a-226e and multiple blocks (or circuits) 228a-228b. The circuits 220a-228b may represent modules and/or blocks that may be implemented as hardware, software, a combination of hardware and software, or other implementations.

The signal DATA_IN may be received by the circuits 220a, 222a and 222b. The signal DATA_OUT_INT may be received by the circuit 224. The signal DATA_OUT may be generated and presented by the circuit 224. The signal STROBE_IN may be received by the circuits 226a, 228a and 228b. The signal STROBE_OUT may be generated and presented by the circuit 226e.

Each circuit 220a-220e may implement a register circuit. The circuits 220a-220e may be operational to buffer (or delay) the signals generated by the respective previous circuit 220a-220d for a clock cycle of the signal CLK. The buffered data may be presented to the next circuit 220b-220e. A total number of circuits 220a-220e may match the total number of block pools (e.g., circuits 204a) in the apparatus 100b.

Each circuit 222a-222b may implement a multiplexer circuit. The circuits 222a-222b may be operational to selectively bypass or not bypass a corresponding set of the circuits 220a-220d. Control of the circuits 222a-222b may be provided by the signals BLOCK_EN_Z[(POOL_NUM−1)× BLOCK_LEN] and BLOCK_EN_Z[(POOL_NUM−2)× BLOCK_LEN] respectively. The total number of circuits 222a-222b may be defined to divide the circuits 220a-220e into the same number of pools in the apparatus 100b.

The circuit 224 may implement a multiplexer circuit. The circuit 224 may be operational to generate the signal DATA_OUT by selectively multiplexing the signal from the last circuit 220e and the signal DATA_OUT_INT. Control of the multiplexing may be provided by a signal (e.g., FB_OUT [0]).

Each circuit 226a-226e may implement a register circuit. The circuits 226b-226e may be operational to buffer (or delay) the signals generated by the respective previous circuit 226a-226d for a clock cycle of the signal CLK. The buffered data may be presented to the next circuit 226b-226e. A total number of circuits 226a-226e may match the total number of block pools in the apparatus 100b.

Each circuit 228a-228b may implement a multiplexer circuit. The circuits 228a-228b may be operational to selectively bypass or not bypass a corresponding set of the circuits 226a-226d. Control of the circuits 228a-228b may be provided by the signals BLOCK_EN_Z[(POOL_NUM−1)× BLOCK_LEN] and BLOCK_EN_Z[(POOL_NUM−2)× BLOCK_LEN] respectively. The total number of circuits 228a-228b may be defined to divide the circuits 226a-226e into the same number of pools in the apparatus 100b.

An operation of the apparatus 100b generally has multiple (e.g., two) phases: a forward phase and a backwards phase. During the forward phase, the apparatus 100b may calculate $Q(X)=X^{(N-K)}D(X)$ div $G(X)$. During the backward phase, the apparatus 100b may calculate $C(X)=G(X)Q(X)$. To perform the calculations, a number of active pool blocks (e.g., the circuits 204a-204b) corresponding to the polynomials $G_1(X),\ldots, G_S(X)$ may match the current error number value T'.

Referring to FIG. 10, a block diagram of an example implementation of a circuit 208 is shown. The circuit 208 may implement a b-unfolded linear feedback shift register circuit. The circuit 208 may be representative of the circuits 208a-208b. The circuit 208 generally comprises multiple blocks (or circuits) 240a-240p, multiple blocks (or circuits) 242a-242p and a block (or circuit) 244. The circuits 240a to 244 may represent modules and/or blocks that may be implemented as hardware, software, a combination of hardware and software, or other implementations.

The signal EN_WIRE[i] may be received by each of the circuits 242a-242p. The signal DATA_EN_OUT may be received by the circuit 244 as a control signal. The vale D and the value Q may be received by the circuit 244. The value Z may be buffered and presented from the circuit 242p.

The circuits 240a-240p may implement adder circuits. The circuits 240b-240p may be operational to generate a sum value by adding the value received from the circuit 244 to a previous value received from a previous circuit 240a-240p-1. The circuit 240a may add the value received from the circuit 244 to a null (zero) value. Each sum may be presented to the next circuit 240b-240p.

Each circuit 242a-242p may implement a register circuit. The circuits 242a-242p may be operational to buffer (or delay) the sums generated by the respective circuit 240a-240p for a clock cycle of the signal CLK. The circuits 242a-242p-1 may present the buffered data to the next circuits 240b-240p. The circuit 242p may present the buffered value Z to the circuits 206a and 210a (see FIG. 8). The circuits 242a-242p may be selectively enabled or disabled by the signals EN_WIRE[i].

The circuit 244 may implement a multiplexer circuit. The circuit 244 is generally operational to selectively multiplex the value D or the value Q to the circuits 240a-240p. Control of the multiplexing may be provided by the signal DATA_EN_OUT.

The functions performed by the diagrams of FIGS. 1-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 1-10 represent logical data flows. The logical data flows are generally representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
a plurality of first circuits implemented with hardware and configured to (i) generate a plurality of intermediate bits by dividing a plurality data bits of a data word by a plurality of minimal polynomials of an encoding along a first path and (ii) generate a plurality of parity bits by multiplying said intermediate bits by said minimal polynomials along a second path, wherein a number of said parity bits is variable based on a configuration signal; and
a second circuit configured to generate a plurality of code bits of a code word by appending said parity bits to a last of said data bits.

2. The apparatus according to claim 1, wherein said first circuits are further configured to vary said number of said parity bits by selectively reconfiguring at least one of said first circuits in response to said configuration signal.

3. The apparatus according to claim 1, wherein (i) an initial one of said first circuits receives at least two of said data bits in parallel on each of a plurality of clock cycles and (ii) said second circuit presents at least two of said code bits in parallel on each of said clock cycles.

4. The apparatus according to claim 1, wherein (i) each of said first circuits comprises at least two sub-circuits and (ii) a number of said minimal polynomials matches a total of said sub-circuits within all of said first circuits.

5. The apparatus according to claim 4, wherein each of said sub-circuits is configured to (i) generate a first signal in said first path by summing elements of a second signal and a third signal and (ii) generate said third signal by performing a linear shift feedback operation on said first signal.

6. The apparatus according to claim 4, wherein each of said sub-circuits is configured to (i) generate a first signal in said second path by summing elements of a second signal and a third signal and (ii) generate said third signal by performing a linear shift feedback operation on said second signal.

7. The apparatus according to claim 1, wherein said encoding comprises one of (i) a BCH encoding, (ii) a binary BCH encoding and (iii) a Reed-Solomon encoding.

8. The apparatus according to claim 1, wherein said first circuits and said second circuits are implemented in at least one of (i) a solid state disk controller and (ii) a hard drive controller.

9. The apparatus according to claim 1, wherein said apparatus is implemented as one or more integrated circuits.

10. A method for variable parity encoding, comprising the steps of:
- (A) generating a plurality of intermediate bits by dividing a plurality data bits of a data word by a plurality of minimal polynomials of said encoding along a first path through a plurality of circuits implemented with hardware;
- (B) generating a plurality of parity bits by multiplying said intermediate bits by said minimal polynomials along a second path through said circuits, wherein a number of said parity bits is variable based on a configuration signal; and
- (C) generating a plurality of code bits of a code word by appending said parity bits to a last of said data bits.

11. The method according to claim 10, further comprising the step of:
varying said number of said parity bits by selectively reconfiguring at least one of said circuits in response to said configuration signal.

12. The method according to claim 10, wherein (i) an initial one said circuits receives at least two of said data bits in parallel on each of a plurality of clock cycles and (ii) at least two of said code bits are presented in parallel on each of said clock cycles.

13. The method according to claim 10, wherein (i) each of said circuits comprises at least two sub-circuits and (ii) a number of said minimal polynomials matches a total of said sub-circuits within all of said circuits.

14. The method according to claim 13, wherein each of said sub-circuits performs the steps of:
generating a first signal in said first path by summing elements of a second signal and a third signal; and
generating said third signal by performing a linear shift feedback operation on said first signal.

15. The method according to claim 13, wherein each of said sub-circuits performs the steps of:
generating a first signal in said second path by summing elements of a second signal and a third signal; and
generating said third signal by performing a linear shift feedback operation on said second signal.

16. The method according to claim 10, wherein said encoding comprises one of (i) a BCH encoding, (ii) a binary BCH encoding and (iii) a Reed-Solomon encoding.

17. The method according to claim 10, wherein said encoding is implemented in at least one of (i) a solid state disk controller and (ii) a hard drive controller.

18. An apparatus comprising:
means for generating a plurality of intermediate bits by dividing a plurality data bits of a data word by a plurality of minimal polynomials of an encoding along a first path through a plurality of circuits implemented with hardware;
means for generating a plurality of parity bits by multiplying said intermediate bits by said minimal polynomials along a second path through said circuits, wherein a number of said parity bits is variable based on a configuration signal; and
means for generating a plurality of code bits of a code word by appending said parity bits to a last of said data bits.

* * * * *